(12) United States Patent
Theiss et al.

(10) Patent No.: US 6,855,636 B2
(45) Date of Patent: Feb. 15, 2005

(54) ELECTRODE FABRICATION METHODS FOR ORGANIC ELECTROLUMINSCENT DEVICES

(75) Inventors: Steven D. Theiss, Woodbury, MN (US); Ha T. Le, St. Paul, MN (US); William A. Tolbert, Woodbury, MN (US); Martin B. Wolk, Woodbury, MN (US); Paul F. Baude, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 296 days.

(21) Appl. No.: 10/285,103

(22) Filed: Oct. 31, 2002

(65) Prior Publication Data

US 2004/0087165 A1 May 6, 2004

(51) Int. Cl.⁷ .............................................. H01L 21/311
(52) U.S. Cl. ...................................... 438/694; 430/200
(58) Field of Search .............................. 438/694, 696, 438/699; 430/200, 273.1, 312

(56) References Cited

U.S. PATENT DOCUMENTS

| | | | |
|---|---|---|---|
| 3,787,351 A | | 1/1974 | Olson |
| 5,725,989 A | | 3/1998 | Chang et al. |
| 6,114,088 A | | 9/2000 | Wolk et al. |
| 6,194,119 B1 | * | 2/2001 | Wolk et al. ............... 430/200 |
| 6,228,555 B1 | | 5/2001 | Hoffend, Jr. et al. |
| 6,242,152 B1 | | 6/2001 | Staral et al. |
| 6,284,425 B1 | | 9/2001 | Staral et al. |
| 6,291,116 B1 | | 9/2001 | Wolk et al. |
| 6,485,884 B2 | * | 11/2002 | Wolk et al. ................ 430/200 |
| 6,610,455 B1 | * | 8/2003 | Burberry et al. ............ 430/200 |
| 6,667,143 B2 | * | 12/2003 | Nirmal et al. ............. 430/200 |
| 2001/0000744 A1 | | 5/2001 | Wolk et al. |
| 2003/0162108 A1 | * | 8/2003 | Burberry et al. ............... 430/20 |

FOREIGN PATENT DOCUMENTS

| | | |
|---|---|---|
| EP | 0 553 496 | 8/1993 |
| EP | 0 951 073 | 10/1999 |
| EP | 1226974 A1 | 7/2002 |
| WO | WO 01/30585 | 5/2001 |
| WO | WO 01/39986 | 6/2001 |
| WO | WO 02/22372 | 3/2002 |
| WO | WO 02/22374 | 3/2002 |

OTHER PUBLICATIONS

U.S. Appl. No. 09/931,598, filed Aug. 16, 2001, Method and Materials for Patterning of an Amorphous, Non–Polymeric, Organic Matrix With Electrically Active Material Disposed Therein.

* cited by examiner

Primary Examiner—Kin-Chan Chen

(57) ABSTRACT

The present invention provides a process for selectively thermally transferring insulators onto organic electroluminescent stacks or layers to electronically isolate adjacent devices upon deposition of electrode material. This can allow the formation of top electrodes for a plurality of organic electroluminescent devices on a substrate via one deposition step to form a single common top electrode or a plurality of electrodes patterned by shadowing due to the presence of the insulators.

13 Claims, 2 Drawing Sheets

ELECTRODE FABRICATION METHODS FOR ORGANIC ELECTROLUMINSCENT DEVICES

This invention relates to methods of patterning layers for organic electroluminescent devices.

BACKGROUND

Pattern-wise thermal transfer of materials from donor sheets to receptor substrates has been proposed for a wide variety of applications. For example, materials can be selectively thermally transferred to form elements useful in electronic displays and other devices. Specifically, selective thermal transfer of color filters, black matrix, spacers, polarizers, conductive layers, transistors, phosphors, and organic electroluminescent materials have all been proposed.

SUMMARY OF THE INVENTION

Selective thermal transfer of active materials can be used to accurately and precisely fabricate organic electroluminescent displays and devices using a wide variety of materials and device constructions. Often, it may be desirable to provide and/or pattern one or more of the organic electroluminescent device layers, such as an electrode layer, using more conventional means such as vapor deposition. The present invention contemplates selective thermal transfer of insulating materials from donor sheets onto device substrates that include one or more patterned layers useful in organic electroluminescent displays. The insulating materials can be used to electronically isolate adjacent devices, and can also be used to help in the patterning of additional device layers such as cathode or anode materials.

In one aspect, the present invention provides a process for forming organic electroluminescent devices that includes the steps of providing a display substrate that has one or more addressable first electrode layers disposed thereon; forming one or more organic electroluminescent layers over at least a portion of the one or more first electrodes on the substrate, thereby defining one or more organic electroluminescent stacks, each stack comprising a portion of one of the one or more organic electroluminescent layers on a portion of one of the one or more first electrode layers; selectively thermally transferring a plurality of insulators from a thermal transfer donor sheet onto the one or more organic electroluminescent layers, leaving exposed at least two portions of the one or more organic electroluminescent stacks; and depositing a second electrode after the step of transferring the plurality of insulators, thereby forming at least two organic electroluminescent devices separated by one or more of the insulators.

In another aspect, the present invention provides a process for forming organic electroluminescent devices, including the steps of providing a display substrate that has a plurality of independently addressable electrode pads disposed thereon; forming one or more organic electroluminescent layers over the electrode pads, each organic electroluminescent layer associated with at least one electrode pad; selectively thermally transferring a plurality of insulators from a thermal transfer donor sheet onto the one or more organic electroluminescent layers, leaving exposed two or more portions of the one or more organic electroluminescent layers; and depositing a common electrode over insulators and exposed organic electroluminescent layers, thereby forming at least two organic electroluminescent devices separated by one or more of the insulators.

Processes of the present invention can be used to pattern insulators to separate adjacent devices when making active matrix organic electroluminescent displays, passive matrix organic electroluminescent displays, monochromatic organic electroluminescent displays, multicolor organic electroluminescent displays, or full color organic electroluminescent displays. Insulators patterned according to the present invention can be barriers to help prevent shorting of adjacent devices upon deposition of a common electrode, or can act as shadowing structures during shadow deposition of an electrode material to enable simple patterning of electrodes.

BRIEF DESCRIPTION OF THE DRAWINGS

The invention may be more completely understood in consideration of the following detailed description of various embodiments of the invention in connection with the accompanying drawings, in which:

FIG. 2(*b*) is a schematic partial cross-sectional view of devices on a display substrate separated by insulating ribs and having a common upper electrode;

FIG. 2(*c*) is a schematic partial cross-sectional view of devices on a display substrate separated by insulating ribs and having a shadow-coated upper electrode.

Figure 1A:
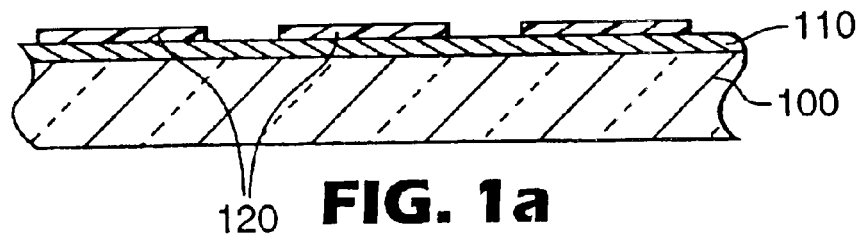
FIGS. 1(*a*) through (*c*) show schematic partial cross-sectional views of device formation steps according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention generally related to forming electrodes for organic electroluminescent (OEL) devices by utilizing selectively thermally transferred insulators to separate adjacent devices. As used in the document, the term OEL refers to any organic electroluminescent material, device or display regardless of whether the emissive material used is a light emitting polymer (LEP), a small molecule emitter (SM), a doped organic emitter, a blend of an organic emitter with any other material, a copolymer that includes an LEP, or any other type of emissive material or composition of emissive layer that can be used as the emissive material of an organic electroluminescent device.

In the present invention, OEL devices can be patterned by first providing a substrate that has a plurality of partially completed OEL devices, referred to herein as "organic electroluminescent stacks", or simply "stacks". These organic electroluminescent stacks preferably include all the layers desired in the final OEL devices except for the layer or layers to be patterned using the fabrication methods of the present invention. For example, each stack may include, in order from the substrate, an electrode (such as an anode or a cathode), a charge transport layer (such as a hole transport layer if the electrode is an anode or an electron transport layer if the electrode is a cathode), and an emissive layer. Other layers may also be present in any suitable location in the stack, for example buffer layers, charge blocking layers, or any other layer now known or later developed that is suitable for including in the final OEL devices. In exemplary cases, the plurality of organic electroluminescent stacks formed on the substrate are formed so that they can be independently addressed when the devices are completed, thereby being capable of being used as a plurality of pixel or sub-pixel elements in a display.

Once the stacks are provided, the present invention contemplates thermally transferring a pattern of insulators, for example between and partially overlapping adjacent stacks to separate adjacent stacks, directly on top of stacks to separate single stacks to make multiple devices, and the like. The patterned insulators can serve to electronically isolate the stacks and/or to create inactive areas so that, upon deposition of the second electrode layer and/or other device layers, a plurality of OEL devices are formed.

Figure 1B:
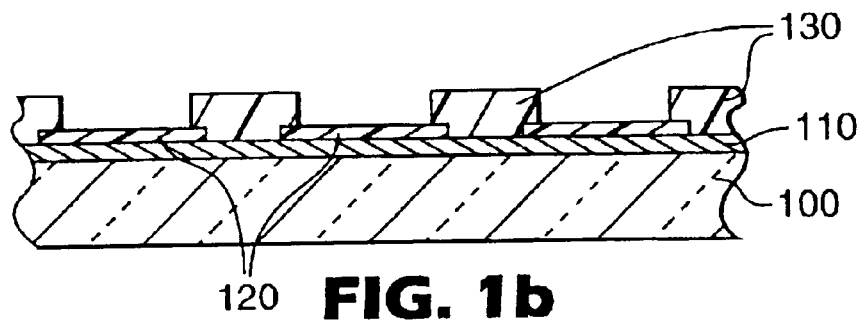
Figure 1C:
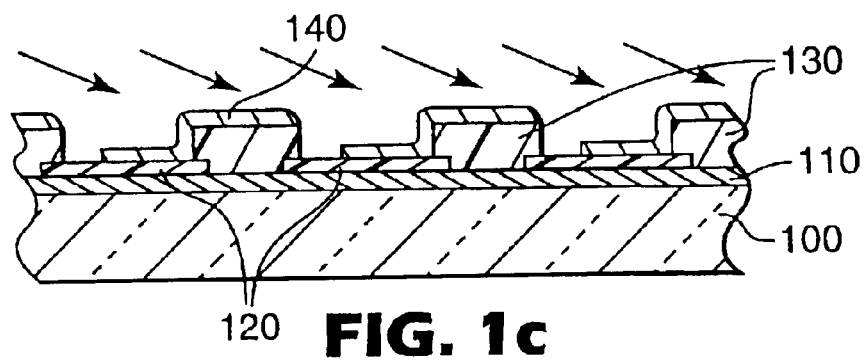

FIGS. 1(a) through (c) illustrate one way of fabricating electrodes for OEL devices according to the present invention. FIG. 1(a) shows bottom electrode 110 disposed on substrate 100, and a plurality of organic electroluminescent emissive layers 120 disposed on the bottom electrode 110. Other layers (not shown) can also be disposed between electrode 110 and emissive layers 120 or on top of emissive layers 120. The regions on the substrate that are covered by the electrode 110 and an emissive layer 120 can be considered an OEL stack.

Substrate 100 can be any substrate suitable for OEL displays including glass, plastic films, stainless steel, crystalline or poly-silicon, or other suitable display substrates. In some instances, the OEL device construction is such that light is intended to be emitted toward a viewer through the substrate. In such cases, substrate 100 may be substantially transparent to the emitted light, and electrode 110 may be a transparent conductive electrode such as a transparent conductive oxide (typically indium tin oxide, or ITO). In other device constructions, substrate 100 need not be transparent to the emitted light because the intended viewer will be positioned on the other side. In these cases, electrode 110 may be any suitable electrode material and need not be transparent.

Electrode 110 can be any material suitable for electrodes in OEL devices and OEL displays. As mentioned, electrode 110 might be ITO or another transparent conductive layer. Electrode 110 is shown in FIG. 1(a) as a continuous layer. In many cases, electrodes like electrode 110 will be provided in a pattern on substrate 100, for example in a series of parallel stripes or in a two-dimensional pattern of pads. In FIG. 1(a), electrode 110 can be envisioned as one of a series of electrode stripes spaced apart along an axis running perpendicular to the plane of the page. Thus, in the cross-sections shown in FIG. 1, only one of such electrodes is visible.

OEL stacks 120 include the organic emissive material 120, and can also include any other layer(s) or material(s) suitable for OEL devices, as mentioned previously. OEL emissive layers 120 can be provided in a pattern on electrodes such as electrode 110, for example in a series of parallel stripes or in a two-dimensional pattern. In FIG. 1(a), emissive layers 120 can be envisioned as a series of parallel stripes running perpendicular to a series of electrode stripes, one of which is electrode 110. The OEL stacks, that is the area where the emissive layers and the electrodes overlap, can define potential pixel or subpixel regions. Adjacent stacks can be designed to emit the same or different colors, for example to achieve monochrome, color, or full color displays. Various methods of patterning emissive layers 120 can be used with success, and the ability to use a particular method generally depends on the construction and materials included in the OEL stacks. For example, small molecule emitter layers and/or charge transport layers can be patterned by deposition through a mask, selective thermal transfer methods, or other suitable methods. Light emitted and conductive or semiconductive polymer materials can be patterned by ink jet methods, selective thermal transfer methods, or other methods. Emitter layers and other device layers may also be patterned by various mask deposition techniques, photolithography, screen printing, ink jet, light or heat induced thermal transfer from a donor, or various other methods now know or later developed.

As shown in FIG. 1, emissive layers 120 are physically separated. However, at least some of adjacent emissive layers 120 (or other layers in adjacent OEL stacks) can be connected over multiple OEL stack regions in one or more directions across the substrate. For example, the stacks might share the same LEP layer where the delineation between stacks is determined by a change in the doping of the LEP so that adjacent regions that are differently doped can emit different colors. For monochromatic displays, the emissive layer can be continuous across the display substrate without doping changes. For passive matrix addressed displays, multiple adjacent stacks will typically share at least one electrode across one direction of the substrate (e.g., electrode stripes) while stacks adjacent in the orthogonal direction share at least one emissive layer.

FIG. 1(b) shows a plurality of insulators 130 disposed between adjacent emissive layers 120 and partially overlapping adjacent stacks. Although FIG. 1(b) is not drawn to scale, insulators 130 will generally rise to some level above the stacks. For example, exemplary insulators 130 are at least as thick as emissive layers 120, and often will be at least twice as thick as the OEL stacks. In FIG. 1(b), the insulators 130 completely cover the portions of the electrode 110 that were shown in FIG. 1(a) to be exposed. Insulators 130 can be any material suitable for desired electrical insulating functionality provided that such material can be selectively thermally transferred from a donor element to the display substrate. Exemplary methods of selective thermal transfer of insulator materials are described in more detail in the discussion that follows.

FIG. 1(c) shows the formation of top electrodes 140 over the emissive layers 120 and insulators 130. The arrows in FIG. 1(c) indicate that the electrode material is being deposited as a substantially collimated beam of material at an angle relative to the display substrate surface normal. Deposition using a substantially collimated beam of material at a non-zero angle relative to the surface normal of the deposition target will be referred to in this document as shadow coating. Because insulators 130 rise to a level above the OEL stacks, a portion of each stack is blocked, or shadowed, by an insulator so that electrode material is not deposited in the shadowed areas. This can create a discontinuity in the coating of electrode 140, thereby forming independent top electrodes. For example, the OEL stacks can be a series of parallel stripes between which a series of parallel stripe insulator ribs 140 are formed to result in a cross-section as shown in FIG. 1(b). Then, the result of shadow coating of the electrode material at a suitable angle will be a stripe electrode associated with each stripe stack. Such a configuration may be especially suited for fabricating top electrodes for passive matrix OEL displays where the bottom electrodes are a series of stripes orthogonal to the top electrode stripes.

The shadow coated electrode(s) 140 can be any suitable material useful as electrodes for display applications. Generally, either bottom electrode 110 or top electrode 140 is substantially transparent to light emitted by the emissive material of the OEL devices. As discussed, transparent conductive oxides can be used as electrode material. In many OEL device constructions, the substrate 100 is glass or another transparent substrate, electrode 110 is a transparent conductive oxide such as ITO and serves as the anode, and the top electrode is the cathode. The material of the cathode is selected for, among other things, its electronic properties. One important factor can be the work function of the cathode material. For this reason, in many OEL device constructions, the cathode includes calcium metal, lithium fluoride, or some other such material. Often, one or more other metallic layers such as aluminum can be deposited on top of a thin layer of calcium or other such metal to form the cathode. However, the present invention is not limited to a particular cathode or anode material, and can be performed using any suitable electrode material capable of being suitably deposited to an appropriate thickness over the organic electroluminescent stacks and insulators. Preferably, the electrode material that is deposited over the stacks and insulators is capable of being vapor deposited, sputter deposited, or otherwise deposited, generally by vacuum techniques, in a collimated beam.

As mentioned previously, other device layers and materials aside from the top electrode material(s) can be deposited over the stacks and insulators before, after, or during shadow coating of the electrode material(s). These other layers and/or materials may or may not also be shadow coated. For example, charge transport materials, color conversion layers, dopants, and other layers and materials useful in OEL displays and devices can be deposited over the stacks and insulators.

Figure 2A:
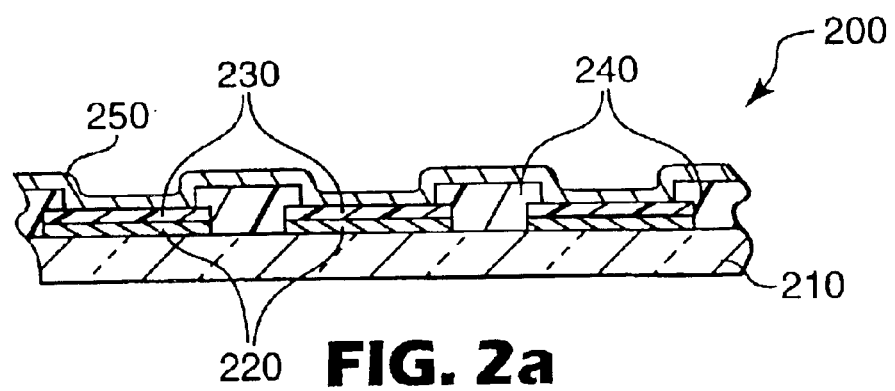
FIG. 2(*a*) is a schematic partial cross-sectional view of devices on a display substrate separated by insulating ribs and having a common upper electrode.

Patterned insulators can also be used to separate devices prior to deposition of a common electrode over all the organic electroluminescent stacks. FIG. 2(a) shows a display 200 that includes substrate 210, a plurality of patterned electrodes 220, a plurality of organic light emitting layers 230, insulators 240 disposed between and partially overlapping the organic electroluminescent stacks, and a common electrode 250 disposed over the stacks and the insulators. Other device layers (not shown) can also be included. The construction shown in FIG. 2(a) may be useful when making active matrix OEL displays where the patterned electrodes 220 are a plurality of ITO anode pads formed on substrate 210 in a rectangular matrix, for example, and suitably connected to address devices such as transistors. Emissive layers 230, as well as other layers such as hole transport layers, can be patterned as stripes aligned with rows or columns of anode pads. Next, insulators 240 can be patterned by selective thermal transfer as stripes between the emissive layer stripes as shown in FIG. 2(a). Finally, a cathode material can be deposited over the emissive stacks and insulators to complete the OEL devices.

Figure 2B:
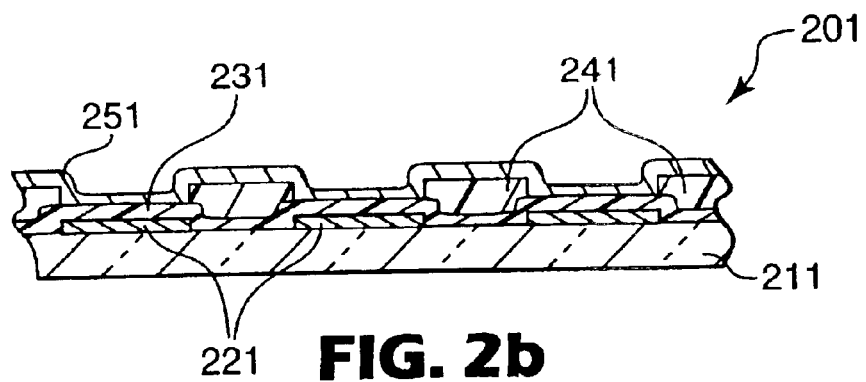

FIG. 2(b) shows another display 201 that includes a substrate 211, a plurality of patterned electrodes 221, single OEL emissive layer 231 formed over all the electrodes 221, insulators 241 disposed on the emissive layer 231 in positions between the electrodes 221, and a common electrode 251 disposed over the insulators 241 and exposed portions of the emissive layer 231. Other device layers (not shown) can also be included. The construction shown in FIG. 2(b) may be useful when making active matrix monochromatic OEL displays. The construction shown in FIG. 2(b) may also be useful when making active matrix full color OEL displays, where the emissive layer 231 is doped with different dopants to achieve different color emission. Emissive layer 231 can be doped in a patterned manner by a shadow masking process, by a selective thermal transfer process, or another suitable process. It may be desirable to pattern dope emissive layer 231 after forming the insulator pattern so that the insulators help to mask adjacent exposed portions of emissive layer 231 from being cross-doped.

Figure 2C:
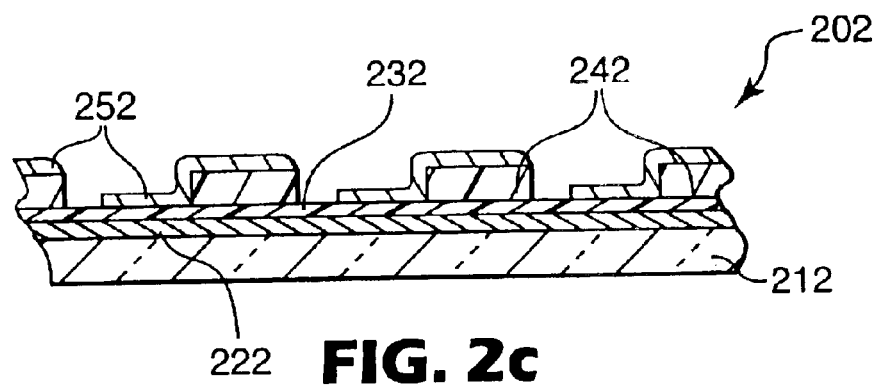

FIG. 2(c) shows another display 202 that includes a substrate 212, a plurality of electrode stripes 222 (shown running parallel to the plane of the page), single OEL emissive layer 232 formed over all the electrode stripes 222, insulators 242 disposed on the emissive layer 232, and a shadow-coated electrode 252 disposed over the insulators 242 and exposed portions of the emissive layer 232. Other device layers (not shown) can also be included. The construction shown in FIG. 2(c) may also be particularly suited to making passive matrix monochromatic OEL displays. In this construction, passive matrix displays can be made that do not require patterning of the emissive layer and that allow for the creation of patterned top electrodes by the single step of shadow coating.

Regardless of the particular device construction and arrangement, after formation of all the desired device layers, the devices can be encapsulated to protect them from water, oxygen, and/or other elements from the surrounding environment that can contaminate, corrode, or otherwise degrade one or more layers or material of the OEL devices.

It can be useful to employ insulator ribs to separate adjacent devices and to help prevent cross-talk between pixels in a display. In the present invention, insulator ribs are patterned by selective thermal transfer from a donor sheet on a display substrate that includes the OEL emissive layers. By patterning the insulators after forming the OEL emissive layers, there may be more flexibility in choosing an insulator material because the deposition method, coating method, patterning method, or other method used to form the OEL emissive layers may not need to be compatible with the insulator rib material. Insulators patterned according to the present invention can also be used to more clearly and cleanly define the edges of the "active" areas, or pixel regions, of a display. Thus, rather than relying on electrode edges and/or emissive layer edges, the edges of the insulators can be used to delineate the edges of the devices. This can provide more freedom and flexibility in choosing electrode materials and/or patterning methods as well as in choosing emissive materials (and other OEL device materials) and/or patterning methods, for example because less attention need be paid to forming clean electrode and/or emissive layer edges. This can allow choosing electrode, emissive, and other device materials based on performance with less regard to clean patternability. At the same time, a wide variety of insulator materials can be selectively thermally transferred from donor sheets to form clean lines and edges for patterns with pitches on the scale of high resolution display sub-pixels.

Figure 3:
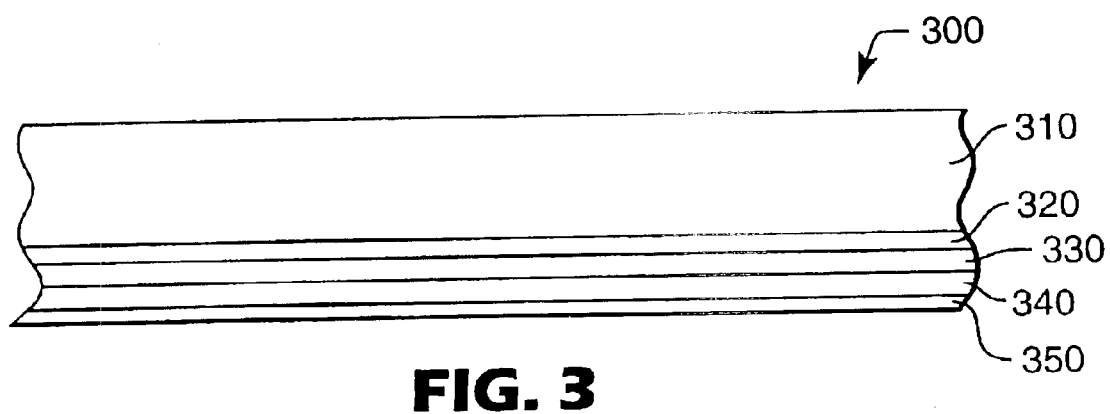
FIG. 3 is a schematic side view of a donor sheet useful for selectively transferring insulators according to the present invention.

FIG. 3 shows an example of a thermal transfer donor 300 suitable for use in transferring insulators according to the present invention. Donor element 300 includes a base substrate 310, an optional underlayer 320, an optional light-to-heat conversion layer (LTHC layer) 330, an optional interlayer 340, and a transfer layer 350. Other layers can also be present. Exemplary donors are disclosed in U.S. Pat. Nos. 5,725,989; 6,114,088; 6,194,119; 6,228,555; 6,242,152; and 6,284,425 and in co-assigned U.S. patent application Ser. Nos. 09/662,980; 09/451,984; and 09/931,598.

In processes of the present invention, materials can be transferred from the transfer layer of a thermal mass transfer donor element to a receptor substrate by placing the transfer layer of the donor element adjacent to a receptor and selectively heating the donor element. Illustratively, the donor element can be selectively heated by irradiating the donor element with imaging radiation that can be absorbed by light-to-heat converter material disposed in the donor, often in a separate LTHC layer, and converted into heat. In these cases, the donor can be exposed to imaging radiation through the donor substrate, through the receptor, or both. The radiation can include one or more wavelengths, including visible light, infrared radiation, or ultraviolet radiation, for example from a laser, lamp, or other such radiation source. Other selective heating methods such as using a thermal print head can also be used. Material from the thermal transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal mass transfer element, and/or the materials of the thermal mass transfer element. The transferred pattern can also be controlled by irradiating the donor element through a mask.

As mentioned, a thermal print head or other heating element (patterned or otherwise) can also be used to selectively heat the donor element directly, thereby pattern-wise transferring portions of the transfer layer. In such cases, the light-to-heat converter material in the donor sheet is optional. Thermal print heads or other heating elements may be particularly suited for making lower resolution patterns of material or for patterning elements whose placement need not be precisely controlled.

The mode of thermal mass transfer can vary depending on the type of selective heating employed, the type of irradiation if used to expose the donor, the type of materials and properties of the LTHC layer, the type of materials in the transfer layer, the overall construction of the donor, the type of receptor substrate, and the like. Without wishing to be bound by any theory, transfer generally occurs via one or more mechanisms, one or more of which may be emphasized or de-emphasized during selective transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby selective heating of a thermal mass transfer donor element can be used to cause the transfer of materials from a transfer layer to receptor surface.

A variety of radiation-emitting sources can be used to heat thermal mass transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 $J/cm^2$ or more. Other radiation sources and irradiation conditions can be suitable based on, among other things, the donor element construction, the transfer layer material, the mode of thermal mass transfer, and other such factors.

When high spot placement accuracy is required (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 µm thick polyimide sheets).

During imaging, the thermal mass transfer element can be brought into intimate contact with a receptor (as might typically be the case for thermal melt-stick transfer mechanisms) or the thermal mass transfer element can be spaced some distance from the receptor (as can be the case for ablative transfer mechanisms or transfer material sublimation mechanisms). In at least some instances, pressure or vacuum can be used to hold the thermal transfer element in intimate contact with the receptor. In some instances, a mask can be placed between the thermal transfer element and the receptor. Such a mask can be removable or can remain on the receptor after transfer. If a light-to-heat converter material is present in the donor, radiation source can then be used to heat the LTHC layer (and/or other layer(s) containing radiation absorber) in an imagewise fashion (e.g., digitally or by analog exposure through a mask) to perform imagewise transfer and/or patterning of the transfer layer from the thermal transfer element to the receptor.

Typically, selected portions of the transfer layer are transferred to the receptor without transferring significant portions of the other layers of the thermal mass transfer element, such as the optional interlayer or LTHC layer. The presence of the optional interlayer may eliminate or reduce the transfer of material from an LTHC layer to the receptor and/or reduce distortion in the transferred portion of the transfer layer. Preferably, under imaging conditions, the adhesion of the optional interlayer to the LTHC layer is greater than the adhesion of the interlayer to the transfer layer. In some instances, a reflective and/or absorptive interlayer can be used to attenuate or otherwise control the level of imaging radiation transmitted through the donor and/or to manage temperatures in the donor, for example to reduce thermal or radiation-based damage to the transfer layer during imaging.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element and/or receptor substrate moved beneath the laser.

Referring back to FIG. 3, various layers of the thermal mass transfer donor element 300 will now be described.

The donor substrate 310 can be a polymer film. One suitable type of polymer film is a polyester film, for example, polyethylene terephthalate (PET) or polyethylene naphthalate (PEN) films. However, other films with sufficient optical properties, including high transmission of light at a particular wavelength, and/or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor. However, as described below, the inclusion of an underlayer between the substrate and an LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an optional adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers.

An optional underlayer 320 may be coated or otherwise disposed between a donor substrate and the LTHC layer, for example to control heat flow between the substrate and the LTHC layer during imaging and/or to provide mechanical stability to the donor element for storage, handling, donor processing, and/or imaging. Examples of suitable underlayers and methods of providing underlayers are disclosed in co-assigned U.S. patent application Ser. No. 09/743,114.

The underlayer can include materials that impart desired mechanical and/or thermal properties to the donor element. For example, the underlayer can include materials that exhibit a low specific heat×density and/or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation and/or reflection of imaging radiation by the underlayer may be used to control heat generation during imaging.

Referring again to FIG. 3, an LTHC layer 330 can be included in thermal mass transfer elements of the present invention to couple irradiation energy into the thermal transfer element. The LTHC layer preferably includes a radiation absorber that absorbs incident radiation (e.g., laser light) and converts at least a portion of the incident radiation into heat to enable transfer of the transfer layer from the thermal transfer element to the receptor.

Generally, the radiation absorber(s) in the LTHC layer absorb light in the infrared, visible, and/or ultraviolet regions of the electromagnetic spectrum and convert the absorbed radiation into heat. The radiation absorber materials are typically highly absorptive of the selected imaging radiation, providing an LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in U.S. Pat. No. 6,228,555, non-homogeneous LTHC layers can be used to control temperature profiles in donor elements. This can give rise to thermal transfer elements that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 $\mu$m or less, and may be about 1 $\mu$m or less. Suitable dyes include those dyes that absorb in the IR region of the spectrum. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other such pigments. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles or as films. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers and/or oligomers with optional polymer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer can be coated, in at least some instances, to a thickness of 0.05 $\mu$m to 20 $\mu$m, preferably, 0.5 $\mu$m to 10 $\mu$m, and, more preferably, 1 $\mu$m to 7 $\mu$m. An inorganic LTHC layer can be coated, in at least some instances, to a thickness in the range of 0.0005 to 10 $\mu$m, and preferably, 0.001 to 1 $\mu$m.

Referring again to FIG. 3, an optional interlayer 340 may be disposed between the LTHC layer 330 and transfer layer 350. The interlayer can be used, for example, to minimize damage and contamination of the transferred portion of the transfer layer and may also reduce distortion in the transferred portion of the transfer layer. The interlayer may also influence the adhesion of the transfer layer to the rest of the thermal transfer donor element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the thermal transfer element to imaging radiation. For polymer interlayers, the thickness of the interlayer typically is in the range of 0.05 $\mu$m to 10 $\mu$m. For inorganic interlayers (e.g., metal or metal compound interlayers), the thickness of the interlayer typically is in the range of 0.005 $\mu$m to 10 $\mu$m.

Referring back to FIG. 3, transfer layer 350 can be any material that can be selectively thermally transferred and is capable of being used as an insulator that separates and electrically isolates adjacent OEL devices and/or counter electrodes in OEL devices and displays. Examples of transfer layer materials include electrically insulating thermoplastic polymers, thermosetting resins, curable or crosslinkable materials, and include classes of materials such as styrenes, acrylates, methacrylates, ethylenes, propylenes, urethanes, amides, and the like, as well as their respective polymers and blends, mixtures, or co-polymers thereof. Transfer layers can also include organic or inorganic particles disposed in a binder, as well as wholly inorganic layers.

Transfer layer 350 preferably has a thickness such that, when transferred onto a device substrate that includes OEL stacks, the insulator ribs are about as thick or thicker than the stacks. In instances where shadow coating is to be used after forming the insulators, the insulators should rise to a level above the stacks that is sufficient to create shadowed areas during shadow coating. The sufficiency of this level depends on, among other things, the available deposition angles, the size of the deposition chamber, the size of the substrate, the spacing and width of the insulators, the degree to which the deposition beam is collimated, and the like. In many cases, it is preferable that the insulators are thick enough so that shadow coating can be performed at angles of about 85° or less from the device substrate normal axis.

The receptor substrate may be any item suitable for a particular application including, but not limited to, glass, transparent films, reflective films, metals, semiconductors, various papers, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide and/or are circuitized with low temperature polysilicon (LTPS) or other transistor structures, including organic transistors.

Suitable flexible substrates include substantially clear and transmissive polymer films, reflective films, transflective films, polarizing films, multilayer optical films, and the like. Flexible substrates can also be coated or patterned with electrode materials and/or transistors, for example transistor arrays formed directly on the flexible substrate or transferred to the flexible substrate after being formed on a temporary carrier substrate. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making OEL devices on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, and other elements useful for electronic displays or other devices.

EXAMPLES

Examples 1–5 demonstrate OEL device fabrication using insulating ribs imaged on top of a light emitting polymer (LEP) layer.

Example 1

Preparation of Device Substrate

A buffer layer of PEDOT (trade designation Baytron 4083 diluted to 30% by weight (w/w) with deionized water, available from Bayer AG, Germany) was spin-coated at 2000 rpm for 30 seconds on an ITO coated glass substrate. The substrate was then dried by placing it on a hot-plate at 110° C. for 5 minutes, resulting in a buffer layer thickness of about 50 nm as measured by a Dektak 8000 (available from Veeco Instruments Inc., Plainview, N.Y.). A primer solution that contained a blend of TPD (N,N' Bis (3-methylphenyl) N,N' dimethylbenzidine, available from Aldrich Chemical Co., Milwaukee, Wis.) and PS (polystyrene, MW=50,000, available from Polysciences Inc., Warrington, Pa.) was then prepared for spin-coating on top of the PEDOT layer in the following manner: 5 g of a 1.5% weight to volume (w/v) solution of PS (0.2 g PS and 13 mL toluene stirred overnight at room temperature) was slowly added (while stirring) to 5 g of a 1.5% (w/v) solution of TPD (0.2 g TPD and 13 mL toluene stirred overnight at room temperature), and stirring was continued for 30 minutes. The primer solution was then filtered through a 0.2 micron nylon filter and spincoated on top of the PEDOT layer at 1500 rpm for 30 seconds, resulting in a primer layer thickness of about 100 nm.

Example 2

Preparation of Donor Substrate

A thermal transfer donor substrate having both an LTHC layer and a protective interlayer was prepared as described, for example, in U.S. Pat. Nos. 5,725,989 and 6,194,119. The formulations that were used for the LTHC layer and the interlayer are given in Table 1.

TABLE 1

| Component | Trade Designation | % By Weight |
|---|---|---|
| LTHC FORMULATION | | |
| Carbon black pigment, available from Columbian Chemicals, Atlanta, GA | Raven 760 Ultra | 3.88 |
| Polyvinylbutyral resin, available from Monsanto, St. Louis, MO | Nutvar ™ B-98 | 0.69 |
| Acrylic resin, available from S. C. Johnson & Son, Racine, WI | Joncryl ™ 67 | 2.07 |
| Dispersing aid, available from Byk Chemie, Wallingford, CT | Disperbyk ™ 161 | 0.34 |
| Fluorochemical surfactant, 3M, St. Paul, MN (synthesizable according to Example 5 of U.S. Pat. No. 3,787,351) | FC-430 | 0.01 |
| Epoxy novolac acrylate | Ebecryl 629 | 13.18 |
| Epoxy novolac acrylate, available from UCB Radcure, Augusta, SC | Elvacite 2669 | 8.79 |
| 2-benzyl-2-(dimethylamino)-1-(4-morpholinyl)phenyl)butanone, photocuring agent, available from Ciba Specialty Chemicals, Tarrytown NY | Irgacure ™ 369 | 0.89 |
| 1-hydroxycyclohexyl phenyl ketone, photocuring agent, available from Ciba Geigy Specialty Chemicals, Tarrytown NY | Irgacure ™ 184 | 0.13 |
| 2-butanone | | 43.75 |
| 1,2-propanediol monomethyl ether acetate | | 26.25 |
| INTERLAYER FORMULATION | | |
| Trimethylolpropane triacrylate ester, available from Sartomer, Exton PA | SR351HP | 14.85 |
| Polyvinylbutyral resin | Butvar ™ B-98 | 0.93 |
| Acrylic resin | Joncryl ™ 67 | 2.78 |
| 2-benzyl-2-(dimethylamino)-1-(4-(morpholinyl)phenyl)butanone, photocuring agent | Irgacure ™ 369 | 1.25 |
| 1-hydroxycyclohexyl phenyl ketone, photocuring agent | Irgacure ™ 184 | 0.19 |
| 2-butanone | | 48.00 |
| 1-methoxy-2-propanol | | 32.00 |

Example 3

Preparation of LEP Donor Film

An LEP blend solution was prepared by slowly adding (while stirring) 3.0 g of a 1.0% (w/w) PS solution (0.10 g of 50,000 MW PS available from Polysciences Inc., Warrington Pa., added to 9.9 g of toluene and stirred overnight at room temperature) to 6 g of a 0.5% (w/v) LEP solution (100 mg PDY132 Super Yellow LEP from Covion Organic Semiconductors GmbH, Frankfurt, Germany; added to 20 mL toluene and stirred for 30 minutes at 60° C., then stirred overnight at room temperature). The mixture was stirred for 30 minutes at room temperature and pre-filtered through a 5 micron nylon filter, resulting in the LEP blend solution. The LEP blend solution was spin-coated at 2000 rpm for 30 seconds onto the interlayer of a donor substrate prepared as described above, resulting in a LEP transfer layer having a thickness of approximately 100 nm.

Example 4

Preparation of Insulating Rib Donor Film

An insulating rib solution was prepared by slowly adding (while stirring) 1 g of a 10% (w/w) PS-co-α-MS solution (1 g of poly(styrene-co-α-methylstyrene) available from Aldrich Chemical Co., Milwaukee Wis. added to 9 g of toluene and stirred for 1 hour at room temperature) to 10 g of a 10% (w/w) PS solution (1 g of 50,000 MW polystyrene available from Polysciences Inc., Warrington Pa. added to 9 g of toluene and stirred for 1 hour at room temperature). The mixture was stirred for 30 minutes at room temperature and pre-filtered through a 0.2 micron nylon filter, resulting in the insulating rib solution. The insulating rib solution was spin coated at 1500 rpm for 30 seconds onto the interlayer of a donor substrate prepared as described above, resulting in an insulator transfer layer thickness of 450 nm.

Example 5

Formation of LEP Stripes, Insulator Ribs and Device

The LEP was deposited on the device substrate as described, for example, in U.S. Pat. No. 6,194,119 by placing the LEP donor film in contact with the primed surface of the device substrate, and imaging as a series of 90 micron wide parallel stripes using a Nd:YAG laser operating at a dose of 0.6 J/Cm$^2$. A distance of 80 microns separated the parallel LEP stripes. Parallel stripes of 100 micron wide insulator ribs were then deposited on the device substrate using the insulating rib donor film, at a dose of 0.45 J/cm$^2$. However, the insulator ribs were imaged onto the spaces between the LEP stripes such that the edges of the insulator ribs overlapped the LEP by 10 microns on each side of the stripe. A cathode was formed by vapor depositing a 400 Å thick calcium layer over the insulating ribs and exposed LEP, followed by vapor depositing a 4000 Å thick silver coating. The LEP emitted light when the ITO anode and the Ag/Ca cathode were connected to a battery.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

Each of the patents, patent documents, and publications cited above is hereby incorporated into this document as if reproduced in full.

What is claimed is:

1. A process for forming organic electroluminescent devices comprising the steps of:

providing a display substrate having one or more addressable first electrode layers thereon;

forming one or more organic electroluminescent layers over at least a portion of the one or more first electrodes on the substrate, thereby defining one or more organic electroluminescent stacks, each stack comprising a portion of one of the one or more organic electroluminescent layers on a portion of one of the one or more first electrode layers;

selectively thermally transferring a plurality of insulators from a thermal transfer donor sheet onto the one or more organic electroluminescent layers, leaving exposed at least two portions of the one or more organic electroluminescent stacks; and depositing a second electrode after the step of transferring the plurality of insulators, thereby forming at least two organic electroluminescent devices separated by one or more of the insulators.

2. The process of claim 1, wherein the step of forming one or more organic electroluminescent layers comprises forming a plurality of parallel stripes of organic electroluminescent material.

3. The process of claim 2, wherein the one or more first electrode layers comprise a plurality of parallel first electrode stripes.

4. The process of claim 3, wherein the plurality of parallel organic electroluminescent stripes are aligned and registered with the plurality of parallel first electrode stripes.

5. The process of claim 3, wherein the plurality of parallel organic electroluminescent stripes are oriented orthogonally to the plurality of parallel first electrode stripes.

6. The process of claim 2, wherein the step of selectively thermally transferring a plurality of insulators comprises thermally transferring a plurality of insulator stripes, each insulator stripe positioned between and in partial overlapping registration with adjacent parallel organic electroluminescent stripes.

7. The process of claim 1, wherein the step of depositing a second electrode comprises directing a collimated beam of a second electrode material at a non-zero angle relative to the display substrate normal axis so that the insulators at least partially mask some areas from being coated with the second electrode material.

8. The process of claim 1, wherein the one or more organic electroluminescent layers are formed by selective thermal transfer of an organic electroluminescent material from a thermal transfer donor sheet to the display substrate.

9. A process for forming organic electroluminescent devices comprising the steps of:

providing a display substrate having a plurality of independently addressable electrode pads disposed thereon;

forming one or more organic electroluminescent layers over the electrode pads, each organic electroluminescent layer associated with at least one electrode pad;

selectively thermally transferring a plurality of insulators from a thermal transfer donor sheet onto the one or more organic electroluminescent layers, leaving exposed two or more portions of the one or more organic electroluminescent layers; and depositing a common electrode over insulators and exposed organic electroluminescent layers, thereby forming at least two organic electroluminescent devices separated by one or more of the insulators.

10. The process of claim 9, wherein the electrode pads are disposed in a two-dimensional regular array on the display substrate.

11. The process of claim 9, wherein the step of forming one or more organic electroluminescent layers comprises forming a plurality of parallel stripes of organic electroluminescent material.

12. The process of claim 11, wherein the step of selectively thermally transferring a plurality of insulators comprises thermally transferring a plurality of insulator stripes, each insulator stripe positioned between and in partial overlapping registration with adjacent parallel organic electroluminescent stripes.

13. The process of claim 9, wherein the one or more organic electroluminescent layers are formed by selective thermal transfer of an organic electroluminescent material from a thermal transfer donor sheet to the display substrate.

* * * * *

UNITED STATES PATENT AND TRADEMARK OFFICE
CERTIFICATE OF CORRECTION

PATENT NO. : 6,855,636 B2
DATED : February 15, 2005
INVENTOR(S) : Theiss, Steven D.

It is certified that error appears in the above-identified patent and that said Letters Patent is hereby corrected as shown below:

<u>Title page, Item [54], and Column 1, line 2,</u>
Title, delete "ELECTROLUMINSCENT" and insert
-- ELECTROLUMINESCENT-- therefor.

<u>Column 5,</u>
Line 52, delete "hole" and insert -- whole -- therefor.

<u>Column 14, Table 1,</u>
Line 33, delete "Nutvar™" and insert -- Butvar™ -- therefor.
Line 47, after "Ciba" delete "Geigy".

<u>Column 15,</u>
Line 42, delete "0.6 J/Cm$^2$" and insert -- 0.6 J/cm$^2$ -- therefor.

Signed and Sealed this

Seventeenth Day of May, 2005

JON W. DUDAS
*Director of the United States Patent and Trademark Office*